(12) United States Patent
Fasshauer

(10) Patent No.: US 10,003,334 B2
(45) Date of Patent: Jun. 19, 2018

(54) CAPACITATIVE SENSOR SYSTEM

(75) Inventor: Peter Fasshauer, Neubiberg (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 548 days.

(21) Appl. No.: 12/743,676

(22) PCT Filed: Nov. 18, 2009

(86) PCT No.: PCT/EP2009/008213
§ 371 (c)(1),
(2), (4) Date: Feb. 25, 2011

(87) PCT Pub. No.: WO2010/057625
PCT Pub. Date: May 27, 2010

(65) Prior Publication Data
US 2011/0304576 A1    Dec. 15, 2011

(30) Foreign Application Priority Data

Nov. 18, 2008   (DE) ........................ 10 2008 057 823

(51) Int. Cl.
*G06F 3/041*    (2006.01)
*G06F 3/045*    (2006.01)
*H03K 17/955*   (2006.01)

(52) U.S. Cl.
CPC . *H03K 17/955* (2013.01); *H03K 2217/96072* (2013.01); *H03K 2217/960705* (2013.01);
(Continued)

(58) Field of Classification Search
CPC .......................................... G06F 3/041–3/047
(Continued)

(56) References Cited

U.S. PATENT DOCUMENTS 3,828,256 A * 8/1974 Liu .............................. 324/133
4,290,052 A * 9/1981 Eichelberger et al. ......... 341/33
(Continued)

FOREIGN PATENT DOCUMENTS

CN   1217835 A   5/1999   .............. G01B 7/00
CN   1705232 A   12/2005  .............. G01B 7/00
(Continued)

OTHER PUBLICATIONS

W.G. Oldham, Review of charging and discharging in RC Circuits, Spring 2001 EECS 42 Lecture 7, Copyright Regents of University of California.*
(Continued)

*Primary Examiner* — Roberto Flores
(74) *Attorney, Agent, or Firm* — Slayden Grubert Beard PLLC

(57) ABSTRACT

The invention relates to a capacitive sensor system, in particular for detecting the approach of objects and in particular also for gesture recognition. The problem of the present invention is to provide a capacitively operating sensor system, which can be implemented with low component complexity and thus low costs and space requirements and is also characterized by low power consumption, so as to operate with batteries having a low charge capacity and/or a long operating time. Said problem is solved according to the invention by a circuit configuration for generating an output signal correlating with an approximation process based on changes in the dielectric properties of the surroundings of a sensor electrode, having a sensor electrode which is adjacent to an observation area in at least some sections, a microcontroller circuit (µC) for output of an alternating voltage, a voltage divider circuit for achieving an adjustment of the level of the alternating voltage output by the microcontroller (µC), and a field effect transistor (FET) in the
(Continued)

function of an impedance converter, wherein the field effect transistor is incorporated into the circuit configuration in such a way that the voltage output by the voltage divider circuit is present at the gate input thereof and at the same time at the sensor electrode (ES).

21 Claims, 4 Drawing Sheets

(52) U.S. Cl.
CPC ............ *H03K 2217/960715* (2013.01); *H03K 2217/960765* (2013.01)

(58) Field of Classification Search
USPC .......... 345/204, 173–178; 178/18.01–19.03; 324/600–699, 519
See application file for complete search history.

(56) References Cited

U.S. PATENT DOCUMENTS

| | | | | |
|---|---|---|---|---|
| 4,789,822 | A | 12/1988 | Ohmatoi | 324/685 |
| 4,939,382 | A | 7/1990 | Gruodis | |
| 5,012,124 | A * | 4/1991 | Hollaway | 307/116 |
| 5,508,700 | A * | 4/1996 | Taylor et al. | 341/33 |
| 5,526,294 | A * | 6/1996 | Ono et al. | 708/143 |
| 5,760,715 | A * | 6/1998 | Senk et al. | 341/33 |
| 5,801,340 | A * | 9/1998 | Peter | 178/20.04 |
| 5,943,516 | A * | 8/1999 | Uchiyama et al. | 396/281 |
| 6,310,611 | B1 | 10/2001 | Caldwell | 345/173 |
| 6,323,846 | B1 * | 11/2001 | Westerman et al. | 345/173 |
| 6,373,474 | B1 * | 4/2002 | Katabami | 345/173 |
| 6,518,820 | B2 * | 2/2003 | Gremm | 327/432 |
| 6,667,563 | B2 * | 12/2003 | Bae et al. | 307/112 |
| 6,714,666 | B1 * | 3/2004 | Morimura et al. | 382/124 |
| 7,119,554 | B2 | 10/2006 | Nakamura et al. | 324/681 |
| 7,148,704 | B2 * | 12/2006 | Philipp | 324/686 |
| 7,375,656 | B2 * | 5/2008 | Muller et al. | 341/33 |
| 7,557,590 | B2 * | 7/2009 | Yakabe | 324/686 |
| 7,605,805 | B2 * | 10/2009 | Jung et al. | 345/173 |
| 7,626,148 | B2 | 12/2009 | Ito | 219/620 |
| 7,851,720 | B2 * | 12/2010 | Raunig | 200/600 |
| 7,884,810 | B2 * | 2/2011 | Jang et al. | 345/174 |
| 7,986,313 | B2 * | 7/2011 | Krah | 345/204 |
| 2001/0019228 | A1 * | 9/2001 | Gremm | 307/112 |
| 2002/0130848 | A1 * | 9/2002 | Sims | 345/173 |
| 2002/0140440 | A1 * | 10/2002 | Haase | 324/678 |
| 2005/0116937 | A1 * | 6/2005 | Choi et al. | 345/173 |
| 2006/0007181 | A1 | 1/2006 | Jung et al. | 345/173 |
| 2006/0017701 | A1 * | 1/2006 | Marten et al. | 345/173 |
| 2006/0290677 | A1 * | 12/2006 | Lyon et al. | 345/173 |
| 2008/0122458 | A1 | 5/2008 | Lenz | |
| 2008/0238444 | A1 * | 10/2008 | Klopfer | 324/662 |
| 2009/0127003 | A1 * | 5/2009 | Geaghan | 178/18.03 |
| 2010/0079401 | A1 * | 4/2010 | Staton | 345/174 |

FOREIGN PATENT DOCUMENTS

| | | | | |
|---|---|---|---|---|
| CN | 1989694 | A | 6/2007 | ............ H01H 36/00 |
| JP | 5291928 | A | 11/1993 | ............ H03K 17/96 |
| JP | 10206169 | A | 8/1998 | .............. B81B 3/00 |
| JP | 2006032085 | A | 2/2006 | ............. G01D 18/00 |
| JP | 2007018839 | A | 1/2007 | ............... G01V 3/08 |
| JP | 2008017432 | A | 1/2008 | ............. H01H 36/00 |
| WO | 97/01835 | A1 | 1/1997 | ............. E05F 15/00 |
| WO | 1998007051 | A | 2/1998 | |

OTHER PUBLICATIONS

Chinese Office Action, Application No. 200980154103.0, 14 pages, dated Mar. 20, 2017.
Albus, Zack, "PCB-Based Capacitive Touch Sensing With MSP430," Application Report, Texas Instruments, 25 pages, Oct. 1, 2007.
International Search Report and Written Opinion, Application No. PCT/EP2009/008213, 15 pages, Mar. 4, 2010.
Japanese Office Action, Application No. 2011535931, 6 pages, dated Oct. 8, 2013.
Chinese Office Action, Application No. 2009801541030, 15 pages, dated Jul. 24, 2014.
Chinese Office Action, Application No. 200980154103.0, 5 pages, dated Jan. 14, 2015.
Taiwan Office Action, Application No. 098139085, 9 pages, dated Jan. 13, 2015.
Chinese Office Action, Application No. 2009801541030, 12 pages, dated Jan. 28, 2014.
Korean Office Action, Application No. 20117014031, 11 pages, dated Dec. 11, 2015.
Korean Office Action, Application No. 20117014031, 10 pages, dated Sep. 5, 2016.

* cited by examiner

CAPACITATIVE SENSOR SYSTEM

CROSS REFERENCE TO RELATED APPLICATIONS

This application is the US national phase of PCT application PCT/EP2009/008213, filed 18 Nov. 2009, published 27 May 2010 as WO2010/057625, and claiming the priority of German patent application 102008057823.1 itself filed 18 Nov. 2008, whose entire disclosures are herewith incorporated by reference.

FIELD OF THE INVENTION

The invention relates to a capacitive sensor system, especially for detecting approaching objects and especially also for gesture detection. The invention relates to a sensor system in which on the base of electric near-fields the approach or movement of typically a hand or a finger is detected, and, from this, information is derived can be used for controlling switching actions or for recognizing a spatial gesture.

BACKGROUND OF THE INVENTION

Especially for gesture detection there are optical processes in the visible or infrared range. Moreover capacitively acting systems are known that acquire the necessary information by the transmission or disturbance of an electric field. The is circuitry expenditure and the cost connected with the realization of such systems are hitherto high. Another problem in the conventional systems consists in the fact that in applications that require battery operation the electricity requirement of such sensors is crucial for practical applicability. Moreover in some applications component costs and space requirement are important, which in case of mass applications, for example in toy industry, can be determining the field of application.

For a capacitive sensor system the evaluation of the capacitance change of a RC low-pass filter structure is known. As excitation signal a sinusoidal voltage or a square signal is used. As signal indicator for the change, the amplitude or the phase or the time difference compared to a reference signal is evaluated. In both approaches (amplitude or phase) it is the relative change $\Delta C/C$ of the capacitance change compared to a basic capacitance C that matters, since by this the sensor sensitivity or the maximum detection range of the sensor is determined. A possibly small basic capacitance is to be aspired therefore for a maximum sensitivity.

The object of the present invention is to provide a capacitively acting sensor system that can be realized with small component expenditure and thus small cost and space requirement and which can be characterized moreover also by a low power consumption, in order to be able to work with batteries with small charging capacitance and/or long service life.

This object is attained solved according to the invention is by a circuit arrangement with the characteristics of claim 1.

With several such systems a two- or three-dimensional position detection is possible. It is also possible to provide several sensor electrodes and to connect them by a multiplexer device successively to the circuit. This multiplexer circuit can be triggered by the microcontroller.

Advantageous embodiments of the circuit arrangement according to the invention are object of the dependent claims.

BRIEF DESCRIPTION OF THE FIGURES

Further particulars and characteristics of the invention result from the following description in association with the drawing. Therein.

DETAILED DESCRIPTION OF THE FIGURES

Figure 1A:
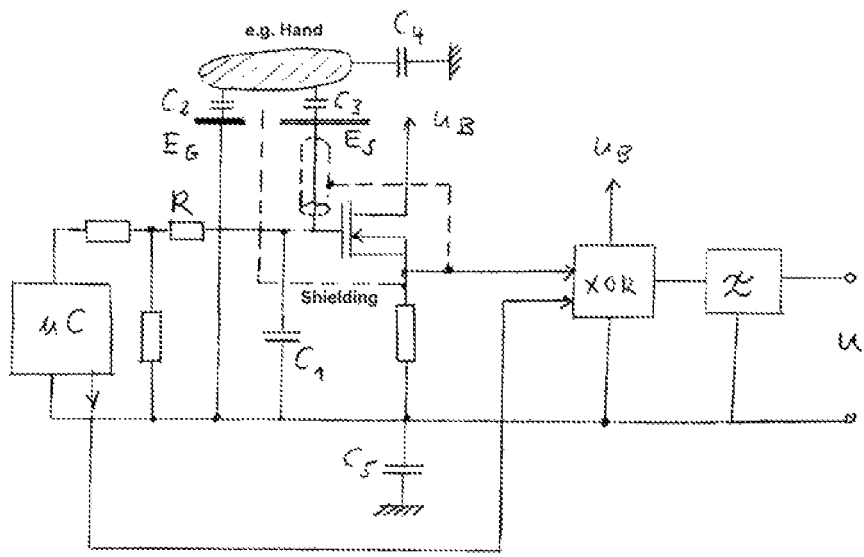
FIG. 1a is a circuit diagram showing the structure of a circuit according to the invention.

In FIG. 1a a circuit arrangement according to the invention is shown. It comprises a capacitive proximity sensor built structured according to the invention. This circuit arrangement can be extended by replication to a sensor system for gesture detection.

Figure 2:
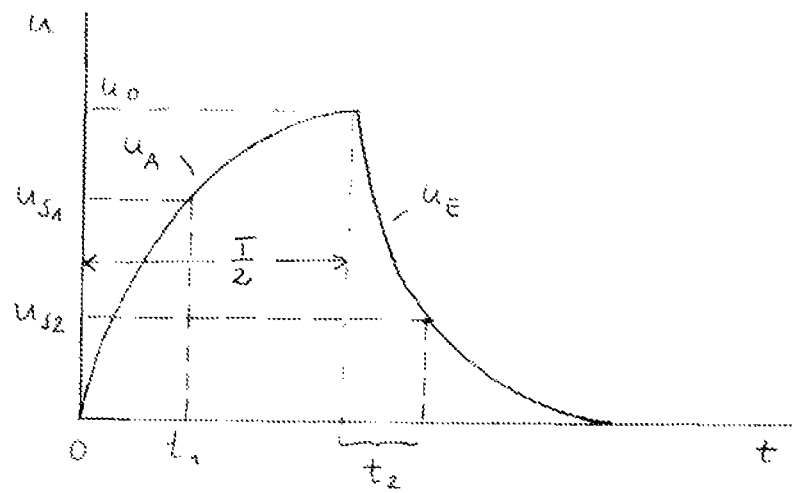
FIG. 2 is a chart showing voltage build-up.

First the operation of this arrangement represented in FIG. 1a is explained more in detail. With a square-wave voltage supplied by a microcontroller (μC) in the frequency range of preferably 80 to 120 kHz, after a level adjustment of the signal by a voltage divider up to an amplitude $u_0$ at the gate terminal of a field-effect transistor (FET) because of several capacitive influences acting there, indicated by C1 to C5, an exponential charge and discharge arises, as shown in FIG. 2.

The parasitic capacitors are on the one hand formed by the field coupling between a signal electrode indicated at $E_s$ and a ground electrode $E_g$ of the circuit arrangement (C1) and on the other hand by coupling capacitors C2 and C3 of a hand approaching these electrodes.

The capacitors C4 and C5 are coupling capacitors of the hand or the circuit ground to earth. At first the charge and discharge in the basic state without approach (C2=C3=C4=0) is considered, with only $C_1$ effective. The time for reaching a determined threshold value $u_{S1}$ is assumed to be t1. The discharge occurs after half a cycle duration T of the square signal according to $u_E$ and after a time t2 again reaches a threshold value $u_{S2}$.

Thus we have:

$$u_{S1}=u_0(1-e^{-t1/RC1}) \quad u_{S2}=u_0 e^{-t2/RC1} \quad (1)$$

From this results for the switching times $$t1=-RC1\ \ln(1-u_{S1}/u_0) \quad t2=-RC1\ \ln(u_{S2}/u_0) \quad (2)$$

With a capacitance change by $\Delta C$ to C1+$\Delta C$ the time difference for the threshold values amounts to $$\Delta t1=-R\Delta C\ \ln(1-u_{S1}/u_0) \text{ and } \Delta t2=-R\Delta C\ \ln(u_{S2}/u_0) \quad (3)$$

The total time difference is $$\Delta t=\Delta t1+\Delta t2=R\Delta C[\ln(u_0/u_{S2})-\ln(1-u_{S1}/u_0)] \quad (4)$$

Equation 4 shows that as $\Delta t$ becomes greater, the closer the threshold $u_{S1}$ is to $u_0$ and the smaller $u_{S2}$ is compared to $u_0$. This means that in choosing the threshold values a suitable hysteresis of a threshold value switch is favorable.

In case of $u_{S1}=u_{S2}$ it is advantageous either to put the threshold as near as possible to $u_0$ or 0, as then one of the two terms in equation 4 as big as possible. Moreover the time difference and thus the sensitivity of the sensor is higher, as the charging resistance and the capacitance change $\Delta C$ increase. The charging resistance is maximized each time during a semi-period T/2 of the square signal still as an almost complete charge and discharge at the gate terminal of a field-effect transistor occurs.

Since R is to become as big as possible, this requirement depends decisively on the capacitance C1 effective between gate terminal and ground (see FIG. 1a). This basic capacitance of the circuit arrangement is composed of several parasitic individual capacitances. A part is composed by the gate-source capacitance of the FET, which is considerably reduced in its effect on the input is due to a counter-coupling by the source resistance. In a sample circuit in this way values of about 0.2 pF are reached.

A further contribution to C1 is supplied by the coupling capacity between the signal electrode ES and the electrode EG connected to ground. In order to minimize this, a so-called shield electrode can be connected between, that is connected to the output of the source follower and therefore has almost the same potential as the gate terminal, by which the coupling ES and EG is considerably reduced. This is another advantageous aspect of the FET stage. The drain terminal of the FET can also be used, in case of a more distanced connection of the signal electrode ES, to drive the braid of a coaxial cable and to reduce the cable capacitance in this way, which would also deliver a contribution to C1.

All this shows that the use of a FET as a source follower as an input stage entails considerable benefits and moreover reduces component expenditure to a minimum, so that both electricity requirement and costs remain very low.

For the evaluation of the time shift of the charge and discharge process in case of approach, a XOR gate terminal is used whose inputs are switched by integrated Schmitt triggers, so that no additional comparator for the switching thresholds $u_{S1}$ and $u_{S2}$ is necessary, and thus further components can be saved. The time difference is represented by a DC voltage obtained by a lowpass filter connected to the XOR output. With a supply voltage $u_B$ is then analogously to equation 4

$$u=RC1u_B/T[\ln(u_0/u_{S2})-\ln(1-u_{S1}/u_0)] \qquad (5)$$

Putting here 1/T=f, it can be seen that the DC voltage formed at the low pass-output is proportional to the frequency f of the square signal delivered by the µC. As due to inevitable tolerances, for example in the threshold values, this voltage can vary in a production process, a possibility for tolerance compensation consists in varying the signal frequency by the µC in such a way that in case of no approach always a constant output voltage results.

Figure 1B:
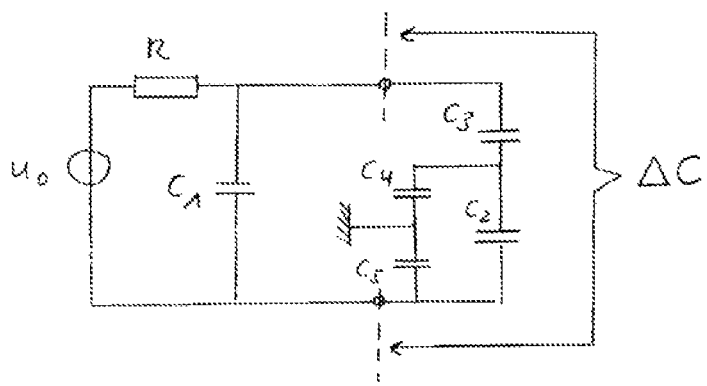
FIG. 1b is an equivalent circuit further showing the change of the capacitor devices with respect capacitance during an approach of an object.

Crucial for the sensitivity of an approaching detection is the capacitive change $\Delta C$ at the gate terminal, which according to equation 4 leads to a corresponding time difference $\Delta t$ and thus, at the low-pass output, to a proportional voltage change $\Delta u \sim \Delta C$. As already stated above, this change depends above all on the coupling capacitances C2 to C5 effective in case of an approach. An equivalent circuit (FIG. 1b) of the arrangement of FIG. 1a illustrates these effects. A greatest possible change at first results for the case in which the ground connection of the sensor is directly connected to earth, as in this case the parallel connection of C2 and C4 is greatest possible, by which also $\Delta C$ reaches the highest possible value. For the case in which the ground connection with earth has no or almost no coupling (C5~0), the serial connection of C2 and C3, i.e. of the coupling capacitances of a part of the body, for example the hand, to the electrodes ES and EG is decisive for the change. In the circuit design it is thus essential to form C2 and C3 as large as possible and C1 as small as possible (for example by shielding).

Figure 3:
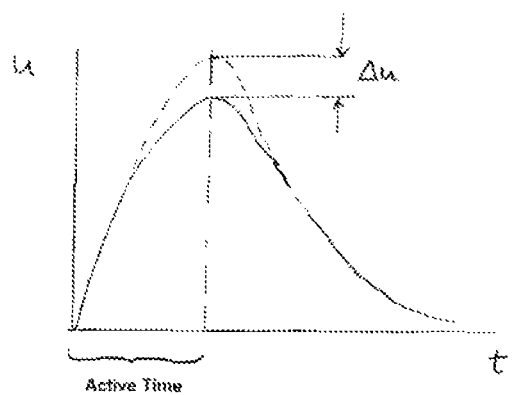
FIG. 3 is another chart showing voltage build-up.

The coupling to the ground electrode $E_G$ does not necessarily have to take place by a separate electrode, but may occur, depending on the application, also by a different coupling by for example the batteries. The arrangement according to the invention of FIG. 1a produces many applications and design possibilities especially as to electrode forms and electrode configurations, for which below examples will be given. The arrangement according to the invention given by FIG. 1a is characterized not only by an extremely low expenditure in components, and thus costs, and small space requirement, but also by an extremely low power consumption in the sensor, which is given substantially by the current flowing through the source resistance of the FET. In case of values of this resistance in the range of some kOhm currents far below 1 mA can be realized in this way. A particularity of this arrangement is that the sensor operation can be pulse-operated, without particular transient problems. In applications with battery power this is frequently an imperative measure in order to guarantee the battery discharge in the range of only some µA and thus an accordingly long service life. In the pulsed mode at the output of the low-pass filter there is no DC voltage, but a charge and discharge impulse represented in FIG. 3. In case of approach the pulse amplitude rises by a value $\Delta u$ that corresponds to that of the continuous operation according to equation 5. By choosing an accordingly low pulse/pause ratio, total currents including µC of few µA can be reached.

In the following two examples for the application of the sensor arrangement are given.

Figure 4:
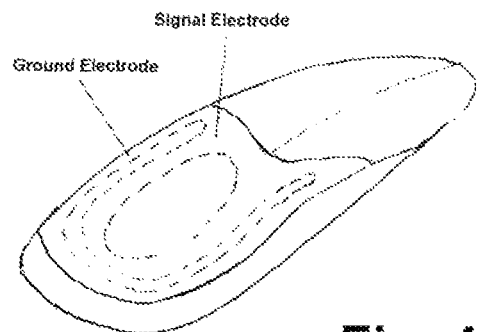
FIG. 4 is a view showing the use of a circuit according to the invention in a computer mouse.

In the first example according to FIG. 4 a cordless computer mouse is switched by the sensors according to the is invention in case of approach of the hand into the active state, in order to limit the battery current to a smallest possible value. For this purpose the signal electrode is mounted on a part of the inner side of the upper shell of the case and can still be surrounded by a stripe-shaped ground electrode. The precise electrode design depends each time on the shape of the case, in which depending on the design of the mouse electronics and the respective battery supply, a separate ground electronics possibly can be avoided, if a sufficient ground coupling of the hand occurs also in another way, for example by the batteries. By application of the pulsed mode at the rate of for example 1:1000 the power consumption from the battery can be reduced by the sensors to 1-2 µA.

Figure 5:
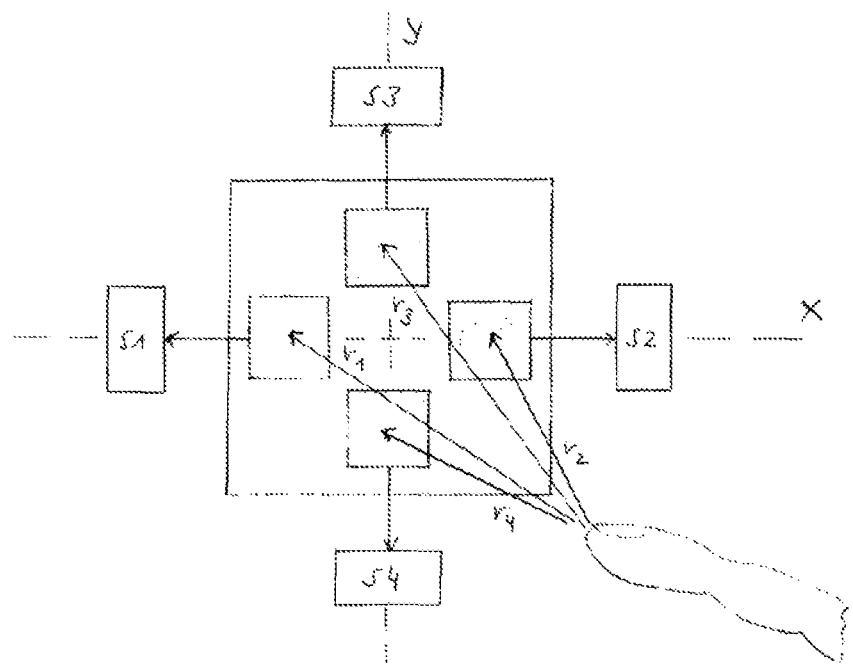
FIG. 5 a view showing the use of a gesture detection system comprising several detection electrodes.

Another example for the application of the proximity sensor is the detection of gestures by a four-electrode system, the principle of which is shown in detail in FIG. 5. The electrode system including its sensor electronics is to remain in a possibly compact form concentrated in a small space, in order to be able to integrate it in a compact way in equipment already present of various types. In this way also the further benefits already explained above arise, namely low-current consumption in view of battery applications as well as economic realization. The task consists in deducing, from the information delivered by the sensors, the x/y coordinates of a gesture relative to the plane defined by the electrodes.

For this purpose, in the system according to FIG. 5, the distances $r_1$ to $r_4$ from a finger performing the gesture are introduced. Thus in a spatial x, y, z coordinate system with the spacing a of the electrode mass centers from the origin, the following four equations result:

$$r_1^2=(x-a)^2+y^2+z^2 \quad (6)$$

$$r_2^2=(x+a)^2+y^2+z^2 \quad (7)$$

$$r_3^2=x^2+(y+a)^2+z^2 \quad (8)$$

$$r_4^2=x^2+(y-a)^2+z^2 \quad (9)$$

By taking the difference of each time equation 6 and 7 or 8 and 9 one immediately obtains the x/y coordinates for $$x=(r_1^2-r_2^2)/4a$$

$$y=(r_3^2-r_4^2)/4a \quad (10)$$

As the equations 6 to 10 show, the x/y coordinates can be calculated in a simple way independently of z. For this purpose the distances $r_1$ to $r_4$ must be determined from the signals that are applied to the output of the four sensors S1 to S4. Only those signal differences are considered that result in case of approach compared to the basic state. These differential signals are designated with $e_1$ to $e_4$ and are deduced from the capacitance variations described above at the respective gate terminals of the field-effect transistors. Decisive for this purpose is each time the coupling capacitance of the finger to the electrodes, which becomes smaller with growing distance from the electrode. As the delivered amplitude of the signal difference according to the above statements is proportional to the capacitance change, these values decrease with growing distance. For this by approximation a power is law is assumed according to $$e(r)=e_0(r_0/r)^\alpha \quad (11)$$

With an exponent α that amounts in practice depending on the electrode arrangement to 2 . . . 3.

The resolution of equation 11 to r gives $$r=r_0(e_0/e)^{1/\alpha} \quad (12)$$

With the equations 10 now the coordinates can be calculated from the signals $e_1$ to $e_4$:

$$x=[(e_0/e_1)^{2/\alpha}-(e_0/e_2)^{2/\alpha}]r_0^2/4a \quad (13)$$

$$y=[(e_0/e_3)^{2/\alpha}-(e_0/e_4)^{2/\alpha}]r_0^2/4a \quad (14)$$

The constants $e_0$, $r_0$ and a here depend on the electrode shapes and orientations of the electrodes relative to each other.

Figure 6:
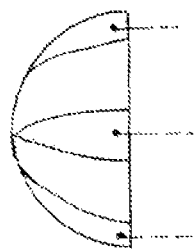
FIG. 6 is two views showing the realization according to the invention of gesture detection systems using detection electrodes that are relatively close to each other.
Figure 6:
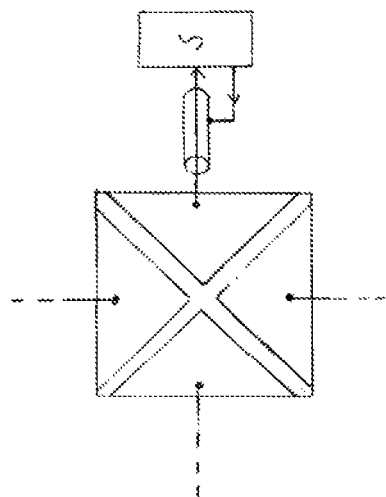

In FIG. 6 different electrode arrangements are shown that are either directly connected with short connections to the electronics, and thus form a compact unit that is only few cm² large and that can be integrated easily in other systems, or by coaxial cable can also be more distant from the electronics, for which purpose preferably the cable braid is connected with the shielding output of the sensor (source connection of the FET) in order to keep low the basic capacitance C1 at the gate terminal connection.

Benefits of the Arrangement

In short with the arrangement according to the invention of a capacitive proximity sensor the following benefits are emphasized once more:

1. The expenditure in components is, with only one FET is input stage, one XOR gate terminal and few resistors and a capacitor, extremely small. The microcontroller necessary for signal generation and processing is, in case of integration of the sensor in other systems, often already present, and can also be used for the simple necessary sensor functions.

2. The FET switched as a source follower delivers, due to the counter-coupling, not only a very small inherent capacitance of the sensor, but moreover can serve as an output for a shielding operation in order to reduce the basic capacitance determining the sensitivity of the sensor. Moreover this measure offers a high temperature stability of the sensor function and reduces sample dispersion.

3. A consequence of the small number of active components is a very low power consumption, which because of very short transient processes of the arrangement, by a pulse-operated operation can be reduced to few μA, which entails considerable benefits when powered by a battery.

4. By appropriate choice of the electrode arrangement the approaching function of a necessary coupling to earth can be solved. This is essential for applications with battery power.

5. A self-calibration of the sensor necessary due to tolerances can take place in a simple way by frequency adjustment.

6. By varying the charging resistance at the gate terminal, a very flexible adjustment to different electrode capacitors due to different electrode sizes can take place. Moreover in this way also an optimal frequency adjustment with respect to foreign disturbers can be done.

7. The reaction time of the sensor can be reduced to a few milliseconds by flexible choice of a possibly high signal frequency.

8. In case of multielectrode arrangements like in sensors for gesture detection the total sensor can be housed in a compact way on only few cm².

A special measure in case of the circuit according to the invention is the particularly simple and thus power and cost-saving realization of the proximity sensor with only one FET stage and a downstream EXOR gate without an additional comparator being required. On the other hand the FET stage delivers, if it is switched as a source follower, an extremely small input capacitance and thus allows a high series resistance determining sensitivity that is higher than that of conventional sensors by as much as a factor of 50. Moreover the stage in this configuration offers at the same time also a shielding function that in critical installation circumstances can hold the basic input capacitance low, and thus no relevant sensitivity loss occurs.

The comparison with conventional sensors shows that the realization of the proximity sensor of the invention according to the RC process also with a smaller number of components even leads to a higher operating efficiency.

The concept according to the invention is characterized by a particularly low power consumption and it is suitable especially for battery applications. The cost, determined mainly by the number of the active components of a circuit arrangement and the space requirement, is clearly lower than that of conventional concepts. The circuit concept according to the invention is suitable in a particularly advantageous way for systems with a simultaneous operation of several sensors, as for gesture applications.

The invention claimed is:

1. A circuit arrangement for generating an output signal correlated with an approach based on changes of the dielectric properties of the environment of a sensor electrode, the circuit arrangement comprising:
   a sensor electrode that at least partly juxtaposed with an observation area;
   a microcontroller outputting a square-wave voltage;
   a voltage attenuation circuit external to said microcontroller receiving the square-wave voltage, the voltage attenuation circuit being directly connected between an output of the microcontroller and ground and adjusting a level of the square-wave voltage outputted by the microcontroller, wherein the voltage attenuation comprises an output connected with the sensor electrode via a charging resistor; and a field-effect transistor (FET) operating as an impedance converter comprising a gate terminal directly connected with the sensor electrode and via the charging resistor with the output of the voltage attenuation circuit, wherein the charging resistor is dimensioned such that during a semi-period of the square-wave voltage an almost complete charge and discharge at the gate terminal of the FET occurs.

2. The circuit arrangement according to claim 1, wherein the field-effect transistor is integrated into the circuit arrangement as a source follower as an input stage.

3. The circuit arrangement according to claim 2, wherein the effect of parasitic capacitors formed by the gate terminal capacitance of the FET, the electrode capacitance relative to ground and structurally conditioned circuit capacitors, is used as a capacitor device C1 for the sensor function.

4. The circuit arrangement according to claim 3, wherein the voltage attenuation circuit comprises a voltage divider comprising a first and second resistor connected in series and the charging resistance is connected between a voltage dividing node of the first and second resistor and the gate terminal.

5. The circuit arrangement according to claim 4, wherein the square-wave voltage is delivered by the microcontroller in the frequency range from 80 to 120 kHz.

6. The circuit arrangement according to claim 5, wherein the capacitor device C1 is charged to a charge voltage $u_0$ and a time interval t1 is determined by a threshold voltage value $u_{S1}$ and discharged after half a cycle duration T of the square signal and a time interval t2 is determined by a threshold voltage value use.

7. The circuit arrangement according to claim 6, wherein the switching times are coordinated in such a way that the following applies:

$$t1=-RC1\ \ln(1-u_{S1}/u_0) t2=-RC1\ \ln(u_{S2}/u_0),$$

wherein R represents the charging resistance.

8. The circuit arrangement according to claim 3, wherein the capacitor device C1 is charged to a charge voltage $u_0$ and a time interval t1 is determined by a threshold voltage value $u_{S1}$ and discharged after half a cycle duration T of the square signal and a time interval t2 is determined by a threshold voltage value use.

9. The circuit arrangement according to claim 5, wherein the charging resistance is determined in such a way that it is at a maximum each time during a half period T/2 of the square signal until an almost complete charge and discharge at the gate terminal of the field-effect transistor occurs.

10. The circuit arrangement according to claim 6, wherein the approach is detected based on a time difference of said time intervals t1, t2.

11. The circuit arrangement according to claim 6, wherein, threshold voltage values $u_{S1}$ and $u_{S2}$ are determined by an XOR gate whose inputs are switched by integrated Schmitt triggers.

12. The circuit arrangement according to claim 11, wherein a time difference is represented by a DC voltage obtained by a low-pass filter connected to the XOR output.

13. The circuit arrangement according to claim 1, wherein a coupling electrode EG connected with ground is provided.

14. The circuit arrangement according to claim 13, wherein the coupling electrode EG, in the form of a coupling capacitance between ES and EG, delivers a further contribution to C1.

15. The circuit arrangement according to claim 13, wherein a shield electrode is provided between the signal electrode ES and the electrode EG.

16. The circuit arrangement according to claim 15, wherein the shield electrode is connected to a source of the FET and lies on almost equal potential as the gate terminal, by which the coupling ES and EG is reduced.

17. The circuit arrangement according to claim 1, wherein a source terminal of the FET is used for driving a braid of a coaxial cable connecting said gate of the FET and said signal electrode ES, in order to reduce a cable capacitance.

18. A circuit arrangement for generating an output signal correlating with an approach of the dielectric properties of the environment because of changes of a sensor electrode, the circuit arrangement comprising:

a sensor electrode at least partly juxtaposed with an observation area;

a microcontroller outputting a square-wave voltage;

a voltage divider external to said microcontroller and being directly connected between an output of the microcontroller and ground and operable to adjust a level of the square-wave voltage outputted by the microcontroller; and a field-effect transistor operating as an impedance converter and configured in such a way that an approach is detected based on an event correlating with the change of a ratio of charging time to discharging time, wherein an output of the voltage divider is connected via a charging resistor to a gate of the field effect transistor and to the sensor electrode, wherein the gate of the field effect transistor is directly connected with the sensor electrode and a drain of the field effect transistor is connected with a supply voltage, and wherein the charging resistor is dimensioned such that during a semi-period of the square-wave voltage an almost complete charge and discharge at the gate terminal of the FET occurs.

19. A circuit arrangement for generating an output signal correlated with an approach based on changes of the dielectric properties of the environment of a sensor electrode, the circuit arrangement comprising:

a sensor electrode that at least partly juxtaposed with an observation area;

a microcontroller outputting a square-wave voltage;

a voltage divider comprising a first and second resistor directly connected in series between an output of the microcontroller and ground for adjusting a level of the square-wave voltage outputted by the microcontroller; and wherein the circuit arrangement further comprises a field effect transistor (FET) stage with only a single FET, wherein the FET having a gate terminal connected directly with the sensor electrode and operating as an impedance converter and integrated into the circuit arrangement in such a way that the voltage outputted by the voltage divider is connected via a charging resistor with the gate terminal and the sensor electrode, wherein the charging resistor is dimensioned such that during a semi-period of the square-wave voltage an almost complete charge and discharge at the gate terminal of the FET occurs.

20. The circuit arrangement according to claim 19, wherein the field-effect transistor is integrated into the circuit arrangement as a source follower as an input stage, and the effect of parasitic capacitors formed by the gate terminal capacitance of the FET, the electrode capacitance relative to ground and structurally conditioned circuit capacitors, is used as a capacitor device C1 for the sensor function.

21. A circuit arrangement for generating an output signal correlated with an approach based on changes of the dielectric properties of the environment of a sensor electrode, the circuit arrangement comprising:
- a sensor electrode that at least partly juxtaposed with an observation area;
- a microcontroller outputting a square-wave voltage;
- a voltage divider for adjusting a level of the square-wave voltage outputted by the microcontroller being directly connected between an output of the microcontroller and ground, wherein the voltage attenuation comprises an output connected with the sensor electrode via a charging resistor; and
- wherein the circuit arrangement further comprises a field effect transistor stage with only a single FET, wherein the single FET operates as an impedance converter comprising a gate terminal directly connected with the sensor electrode and via the charging resistor with the output of the voltage attenuation circuit and wherein a source of the FET provides the output signal.

* * * * *

UNITED STATES PATENT AND TRADEMARK OFFICE
CERTIFICATE OF CORRECTION

PATENT NO. : 10,003,334 B2
APPLICATION NO. : 12/743676
DATED : June 19, 2018
INVENTOR(S) : Peter Fasshauer et al.

Page 1 of 1

It is certified that error appears in the above-identified patent and that said Letters Patent is hereby corrected as shown below:

In the Claims

Column 7,
Claim 6, Line 36, "...voltage value use..." ---Change to--- "...voltage value $u_{S2}$..."

Signed and Sealed this
Twenty-third Day of October, 2018

Andrei Iancu
*Director of the United States Patent and Trademark Office*